(12) United States Patent
Chen

(10) Patent No.: US 12,395,172 B2
(45) Date of Patent: *Aug. 19, 2025

(54) TOUCH INPUT DEVICE

(71) Applicant: Darfon Electronics Corp., Taoyuan (TW)

(72) Inventor: Chao-Yu Chen, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/670,812

(22) Filed: May 22, 2024

(65) Prior Publication Data

US 2024/0421818 A1    Dec. 19, 2024

Related U.S. Application Data

(60) Provisional application No. 63/472,823, filed on Jun. 14, 2023.

(30) Foreign Application Priority Data

Jan. 3, 2024   (TW) ................................. 113100307

(51) Int. Cl.
  *H03K 17/96*   (2006.01)
  *G06F 3/02*    (2006.01)
(52) U.S. Cl.
  CPC ..... *H03K 17/9629* (2013.01); *H03K 17/9631* (2013.01); *H03K 17/9638* (2013.01); *G06F 3/021* (2013.01); *H03K 2217/96042* (2013.01)

(58) Field of Classification Search
  CPC .......... H03K 17/9629; H03K 17/9631; H03K 17/9638; H03K 2217/96042; G06F 3/021
  See application file for complete search history.

(56) References Cited

U.S. PATENT DOCUMENTS

| 2,015,212 A | 9/1935 | Beaumont |
| 2,019,625 A | 11/1935 | O'Brien |

(Continued)

FOREIGN PATENT DOCUMENTS

| CN | 202871649 U | 4/2013 |
| CN | 203012648 U | 6/2013 |

(Continued)

*Primary Examiner* — Amine Benlagsir
(74) *Attorney, Agent, or Firm* — McClure, Qualey & Rodack, LLP

(57) ABSTRACT

A touch input device includes a circuit board, a plurality of illuminant elements disposed on the circuit board, a spacer disposed over the circuit board, a plurality of light guide plates, a shielding sheet, and a top plate. The circuit board has a board edge and an upper surface having a plurality of sensing regions. The spacer has a light-leaking edge and a plurality of accommodation holes for accommodating the illuminant elements and the light guide plates. The shielding sheet includes a main section covering the spacer, a first extension section covering the light-leaking edge and the board edge, and a second extension section combined with the circuit board. The main section has a plurality of light permeable regions respectively corresponding to the light guide plates. The top plate is disposed on the main section and has a plurality of light-exit regions.

20 Claims, 9 Drawing Sheets

(56) References Cited

U.S. PATENT DOCUMENTS

| | | | | |
|---|---|---|---|---|
| 7,294,803 B2* | 11/2007 | Lee | | H01H 13/83 |
| | | | | 200/341 |
| 7,432,464 B2* | 10/2008 | Chiu | | H01H 13/83 |
| | | | | 200/341 |
| 7,446,274 B2* | 11/2008 | Choi | | H01H 13/83 |
| | | | | 200/310 |
| 7,498,534 B2* | 3/2009 | Hoyle | | G02B 6/0036 |
| | | | | 200/314 |
| 7,609,178 B2* | 10/2009 | Son | | G06F 3/016 |
| | | | | 361/287 |
| 7,683,279 B2* | 3/2010 | Kim | | H01H 13/83 |
| | | | | 200/310 |
| 7,705,259 B2* | 4/2010 | Kenmochi | | H04M 1/23 |
| | | | | 200/5 A |
| 7,939,773 B2* | 5/2011 | Tsai | | G06F 3/0202 |
| | | | | 200/313 |
| 9,847,380 B2 | 12/2017 | Yamazaki | | |
| 10,332,859 B2 | 6/2019 | Nakamura | | |
| 2008/0303698 A1* | 12/2008 | Casparian | | G06F 3/0238 |
| | | | | 463/47 |
| 2009/0021400 A1* | 1/2009 | Tsai | | G06F 3/0216 |
| | | | | 400/490 |
| 2009/0040075 A1* | 2/2009 | Liu | | H01H 13/83 |
| | | | | 341/22 |
| 2009/0107823 A1* | 4/2009 | Liu | | H01H 13/83 |
| | | | | 200/317 |
| 2009/0121904 A1* | 5/2009 | Liu | | H01H 13/83 |
| | | | | 362/253 |
| 2014/0077670 A1 | 3/2014 | Degner | | |
| 2015/0042902 A1 | 2/2015 | Enomoto | | |
| 2016/0103272 A1 | 4/2016 | Sun | | |

FOREIGN PATENT DOCUMENTS

| | | |
|---|---|---|
| CN | 106024476 B | 7/2018 |
| CN | 109952814 B | 12/2022 |
| CN | 117251076 A | 12/2023 |
| TW | M429135 U1 | 5/2012 |
| TW | 201935683 A | 9/2019 |
| WO | 2013038655 A1 | 3/2013 |

* cited by examiner

TOUCH INPUT DEVICE

CROSS REFERENCE TO RELATED APPLICATIONS

This application claims the priority benefit of U.S. provisional application Ser. No. 63/472,823 filed on Jun. 14, 2023 and also claimed the priority benefit of Taiwan patent application No. 113100307, filed on Jan. 3, 2024. The entirety of the above-mentioned patent applications is hereby incorporated by reference herein and made a part of this specification.

BACKGROUND OF THE INVENTION

1. Field of the Invention

The invention generally relates to an input device for an electronic device. Particularly, the invention relates to a touch input device.

2. Description of the Prior Art

The input device of electronic devices, such as a keyboard, is pressed by the user to transmit an input signal to the electronic device. A common keyboard includes a plurality of independent keys, and the types of keys may be, for example, mechanical keys, membrane switch keys, or optical sensing switch keys. Mechanical keys have a complicated structure and are large in size, not suitable for use in electronic devices in need of thinning feature (such as laptop computers). Keyboards currently used in thin type electronic devices mainly use membrane switch keys, but more and more keyboards are beginning to use optical sensing switch keys as the type of keys of the keyboard.

As the functions of thin type electronic devices increase, in addition to the keyboard, the input device also includes a touch bar. The touch bar has multiple touch areas for users to perform touch operations, making the electronic device perform different functions. A conventional touch bar has a backlight module disposed inside to illuminate the touch bar. If the backlight module is poorly assembled, light leakage may occur in the touch bar.

SUMMARY OF THE INVENTION

It is an object of the invention to provide an touch input device, which can prevent from leaking light.

In an embodiment, the invention provides a touch input device including a circuit board, a plurality of illuminant elements, a spacer, a plurality of light guide plates, a shielding sheet, and a top plate. The circuit board has an upper surface, a lower surface, and a board edge. The upper surface has a plurality of sensing regions arranged along a long axis direction. The plurality of illuminant elements are disposed on the upper surface of the circuit board and arranged along the long axis direction. The spacer is disposed over the upper surface of the circuit board. The spacer has a top surface, a bottom surface, and a light-leaking edge. The spacer has a plurality of accommodation holes penetrating through the top surface and the bottom surface and corresponding to the plurality of sensing regions. The light-leaking edge corresponds to the board edge of the circuit board. The plurality of illuminant elements extend into the plurality of accommodation holes, respectively. The plurality of light guide plates are disposed in the plurality of accommodation holes, respectively. The shielding sheet includes a main section, a first extension section, and a second extension section. The main section covers the top surface of the spacer and has a plurality of light permeable regions. The light permeable regions are arranged along the long axis direction and respectively correspond to the plurality of light guide plates. The first extension section covers the light-leaking edge of the spacer and the board edge of the circuit board. The second extension section is connected to the first extension section and combined with the lower surface of the circuit board. The top plate is disposed on the main section of the shielding sheet. The top plate has a plurality of light-exit regions arranged along the long axis direction and respectively corresponding to the plurality of light permeable regions of the main section of the shielding sheet.

By covering the light-leaking edge of the spacer and the board side of the circuit board with the first extension section of the shielding sheet, light from the illuminant elements can be blocked to prevent the leakage of light.

In another embodiment, the invention provides a touch input device including a circuit board, a plurality of illuminant elements, a reflective layer, a spacer, a plurality of light guide plates, a shielding sheet, and a top plate. The circuit board has an upper surface and a lower surface. The upper surface has a plurality of sensing regions arranged along a long axis direction. The plurality of illuminant elements are disposed on the upper surface of the circuit board and arranged along the long axis direction. The reflective layer includes a main reflective section, a first extension section, and a second extension section. The main reflective section is disposed on the upper surface of the circuit board and has a plurality of through holes. The plurality of through holes are arranged along the long axis direction, and the plurality of illuminant elements extend through the plurality of through holes, respectively. The spacer is disposed over the main reflective section of the reflective layer. The spacer has a top surface, a bottom surface, and a light-leaking edge. The spacer has a plurality of accommodation holes penetrating through the top surface and the bottom surface. The plurality of accommodation holes are arranged along the long axis direction and respectively corresponding to the plurality of sensing regions and the plurality of through holes. The plurality of illuminant elements extend into the plurality of accommodation holes, respectively. The plurality of light guide plates are disposed in the plurality of accommodation holes of the spacer, respectively. The shielding sheet covers the top surface of the spacer. The shielding sheet has a sheet edge and a plurality of light permeable regions. The sheet edge corresponds to the light-leaking edge of the spacer. The plurality of light permeable regions are arranged along the long axis direction and respectively correspond to the plurality of light guide plates. The top plate is disposed on the shielding sheet. The top plate has a plurality of light-exit regions arranged along the long axis direction and respectively correspond to the plurality of light permeable regions of the shielding sheet. The first extension section of the reflective layer covers the light-leaking edge of the spacer and the sheet edge of the shielding sheet. The second extension section of the reflective layer is connected to the first extension section and combined with the top plate.

By covering the light-leaking edge of the spacer and the sheet edge of the shielding sheet with the first extension section of the reflective layer, light from the illuminant elements can be blocked to prevent the leakage of light.

DETAILED DESCRIPTION OF THE PREFERRED EMBODIMENT

Figure 1:
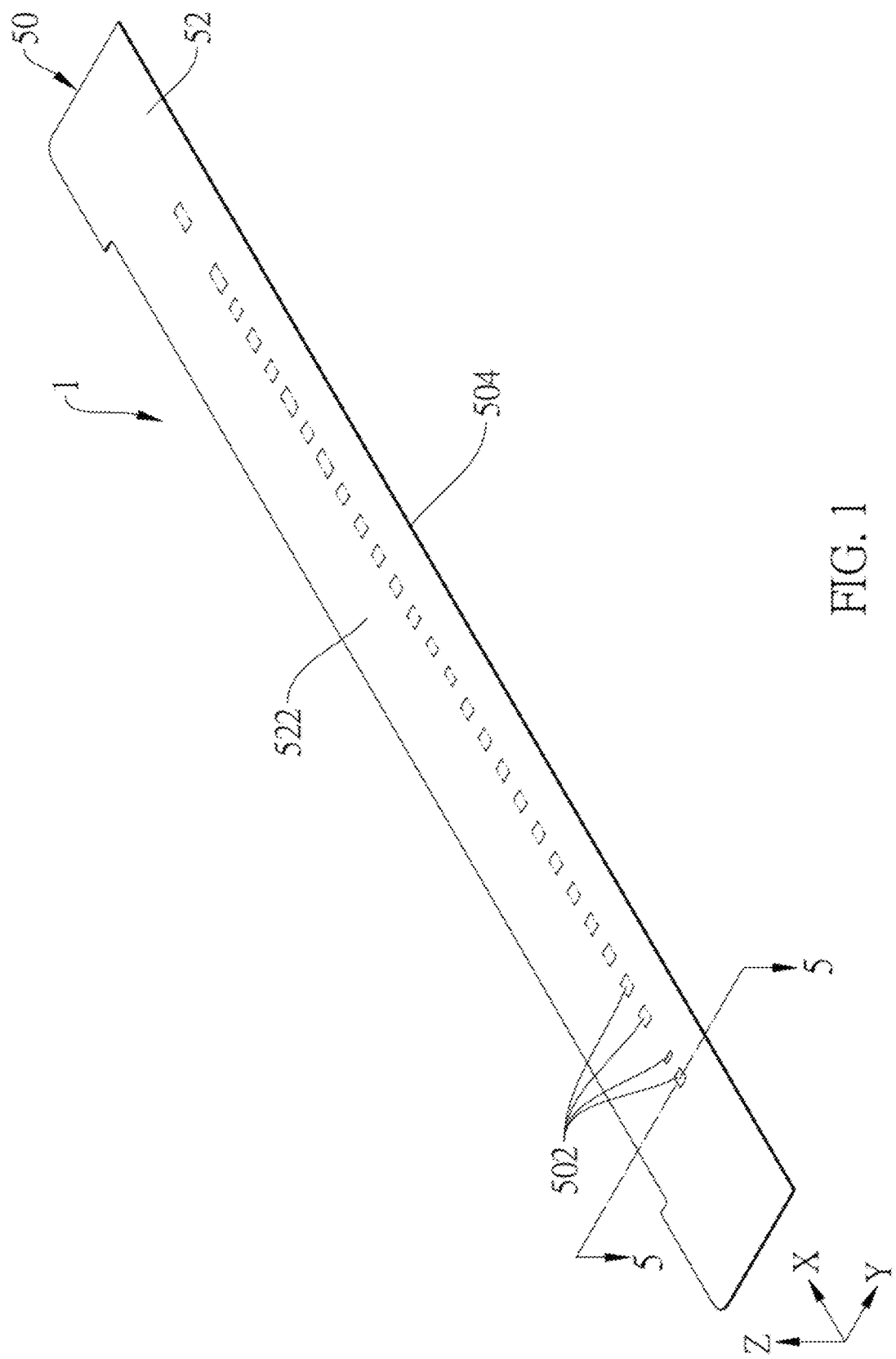
FIG. 1 is a perspective view of the touch input device in a first embodiment of the invention.
Figure 2:
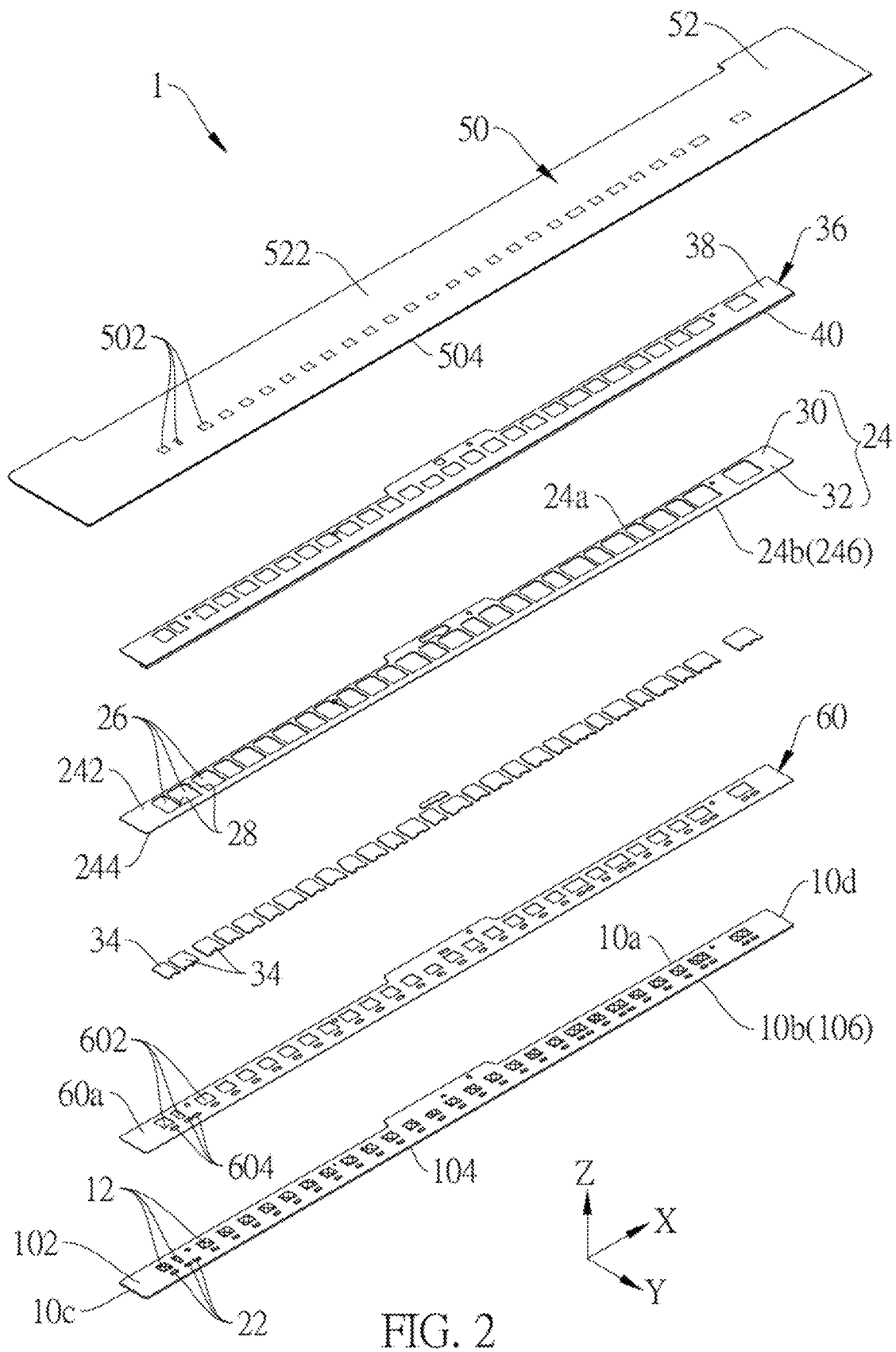
FIG. 2 is an exploded view of the touch input device in the first embodiment of the invention.
Figure 3:
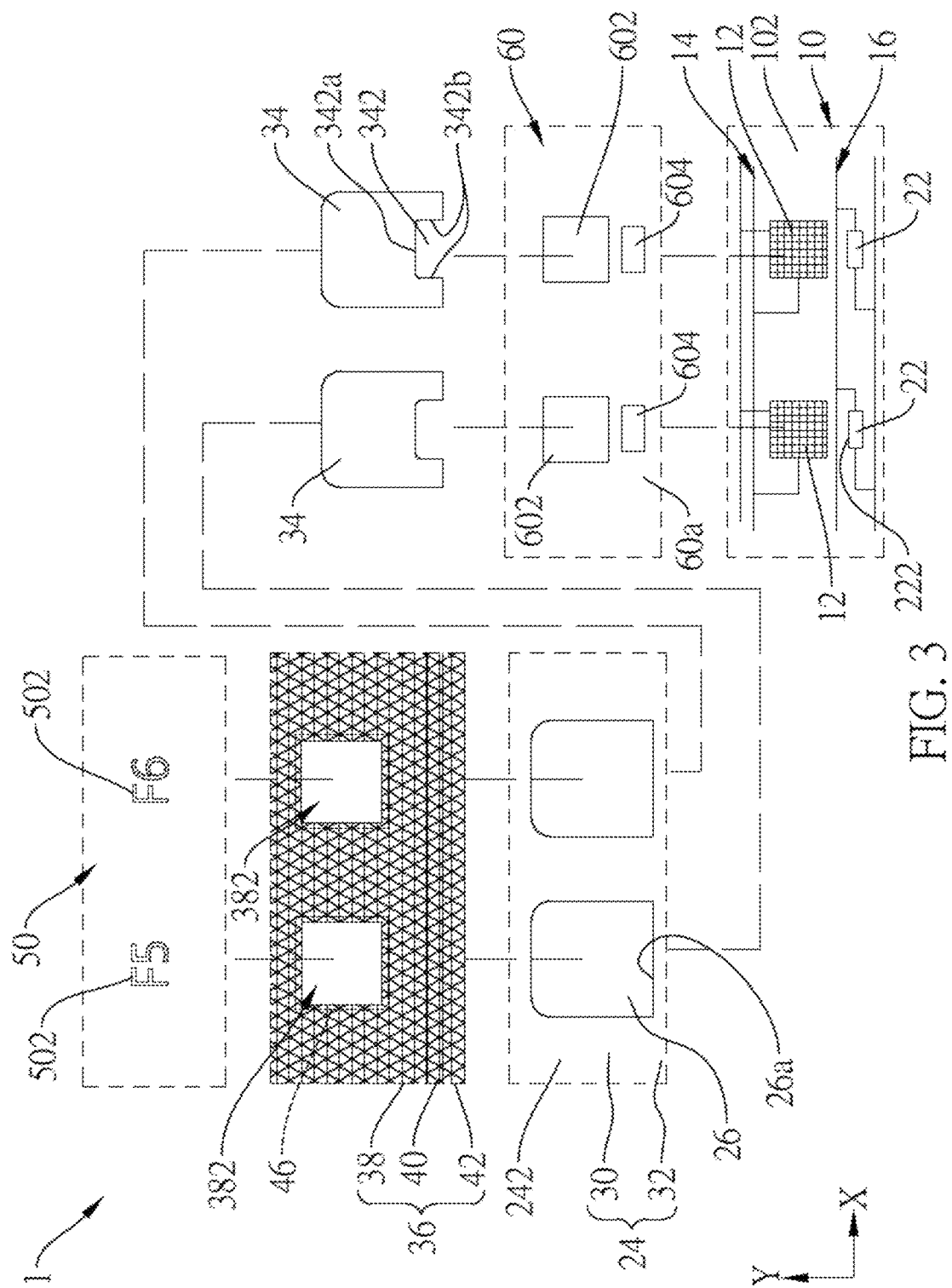
FIG. 3 is a partially exploded view of the touch input device in the first embodiment of the invention.
Figure 4:
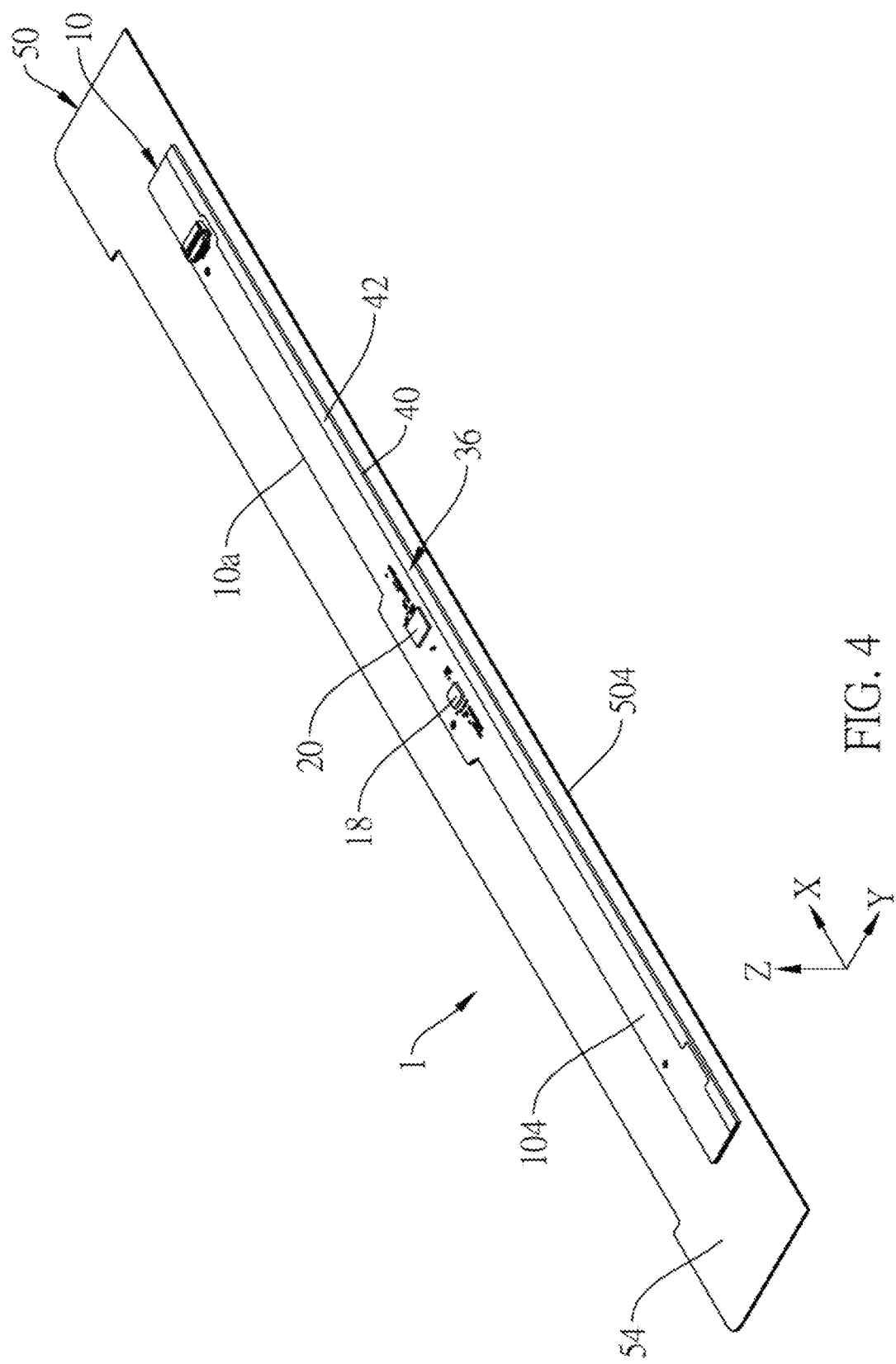
FIG. 4 is a perspective view of the touch input device in the first embodiment of the invention from another viewing angle, wherein the backside of the touch input device is shown.
Figure 5:
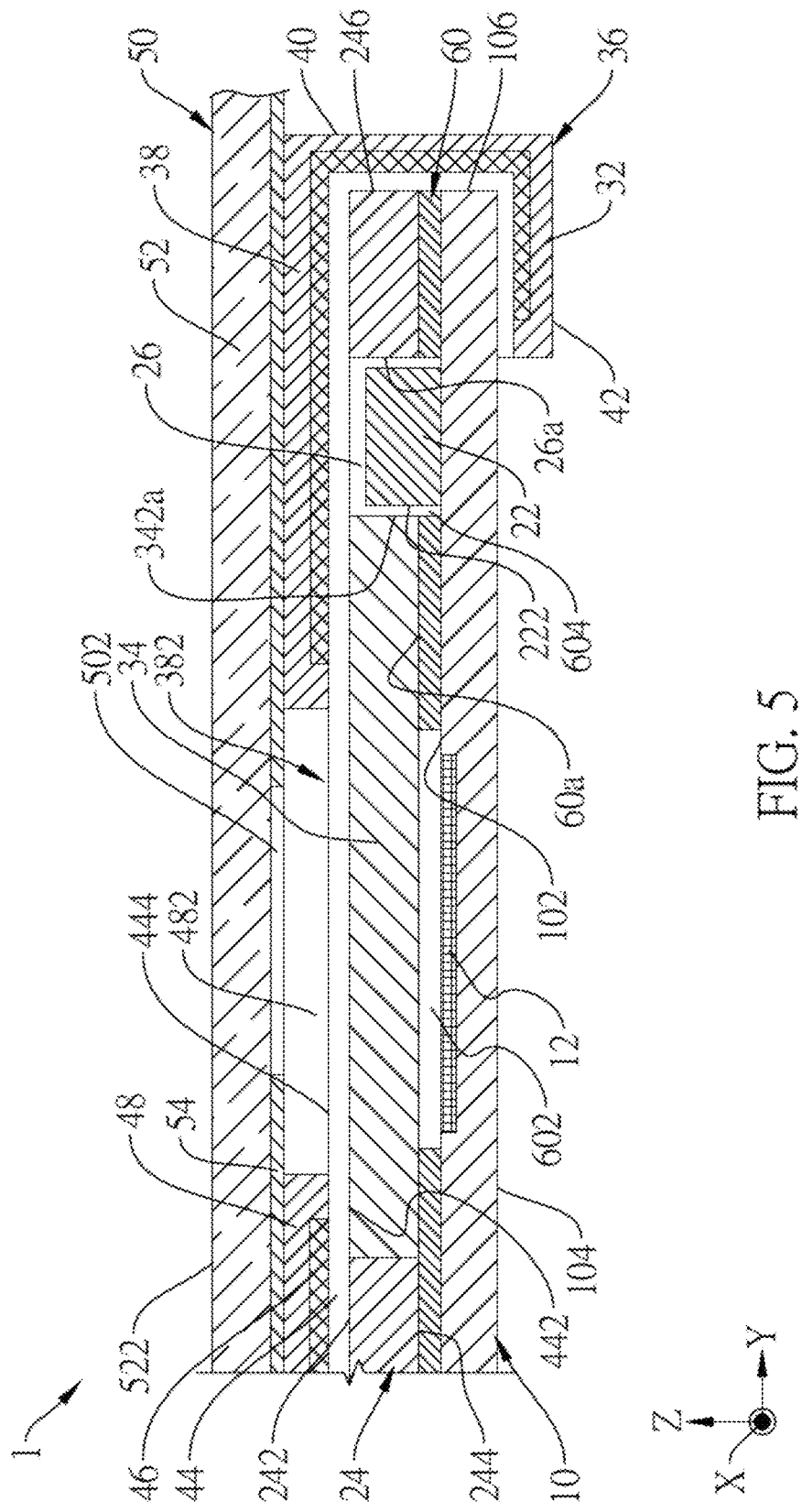
FIG. 5 is a schematic cross-sectional view of FIG. 1 along the 5-5 direction.

In order to illustrate the invention more clearly, the preferred embodiments will be described in detail with reference to the drawings. Referring to FIG. 1 to FIG. 5, the touch input device 1 in a first embodiment is shown. In this embodiment, the touch input device 1 has a rectangular shape. For illustration, a long axis direction X, a short axis direction Y, and a stacking direction Z which are perpendicular to each other are defined. The touch input device 1 includes a circuit board 10, a plurality of illuminant elements 22, a spacer 24, a plurality of light guide plates 34, a shielding sheet 36, and a top plate 50.

The circuit board 10 has an upper surface 102, a lower surface 104, and a board edge 106. In this embodiment, the circuit board 10 has two long sides 10a, 10b and two short sides 10c, 10d. The two long sides 10a, 10b are opposite to each other in the short axis direction Y, and each of the long sides 10a, 10b extends along the long axis direction X. The two short sides 10c, 10d are opposite to each other in the long axis direction X, and each of the short sides 10c, 10d extends along the short axis direction Y. The upper surface 102 has a plurality of sensing regions 12, and the sensing regions 12 are arranged along the long axis direction X and coupled to a sensing circuit 14. Each sensing region 12 is configured to sense a touch operation of the user to generate a corresponding touch signal. The lower surface 104 is provided with a reading component 18 and a light source driving component 20. The reading component 18 is electrically coupled to the sensing regions 12 through the sensing circuit 14 to obtain the touch signal generated by each of the sensing regions 12.

The illuminant elements 22 are disposed on the upper surface 102 of the circuit board 10 and arranged along the long axis direction X. The illuminant elements 22 are electrically coupled to the light source driving component 20 through a light source circuit 16 on the upper surface 102 of the circuit board 10. Through the light source circuit 16, the light source driving component 20 drives each of the illuminant elements 22 to emit light. In this embodiment, in the short axis direction Y, each of the illuminant elements 22 is located at one side of each of the sensing regions 12. Each of the illuminant elements 22 is taken the light-emitting diode as an example and has a side light-emitting surface 222. Each side light-emitting surface 222 faces toward each sensing region 12 in the short axis direction Y. More specifically, each of the illuminant elements 22 is located between each of the sensing regions 12 of the circuit board 10 and one of the long sides (e.g. 10b), and the other long side (e.g. 10a) is farther away from the illuminant elements 22. One of the two long sides 10a, 10b of the circuit board 10 that is closer to the illuminant elements 22 (e.g. 10b) constitutes the board edge 106.

In this embodiment, the touch input device 1 can optionally include a reflective layer 60. The reflective layer 60 is disposed on the upper surface 102 of the circuit board 10. The reflective layer 60 is disposed on the upper surface 102 of the circuit board 10 along the stacking direction Z. For example, the reflective layer 60 is implemented as a reflective plate and glued on the upper surface 102 of the circuit board 10, but not limited thereto. The reflective layer 60 can be a reflective coating, which is coated on the upper surface 102 of the circuit board 10. The reflective layer 60 has a plurality of openings 602 and a plurality of through holes 604. The openings 602 are arranged along the long axis direction X and respectively correspond to the sensing regions 12 of the circuit board 10. In the stacking direction Z, each sensing region 12 is located within each opening 602. The through holes 604 are arranged along the long axis direction X, and the illuminant elements 22 extend through the through holes 604, respectively. The reflective layer 60 has an upper reflective surface 60a, and the upper reflective surface 60a faces away from the circuit board 10. In an embodiment, the reflective layer 60 may not be provided with the openings 602, and the sensing regions 12 of the circuit board 10 are covered by the reflective layer 60. Each sensing region 12 can still sense the touch operation of the user.

The spacer 24 is disposed over the upper surface 102 of the circuit board 10 along the stacking direction Z. The spacer 24 has a top surface 242, a bottom surface and a light-leaking edge. In this embodiment, the spacer 24 is disposed on the reflective layer 60 along the stacking direction Z. For example, the spacer 24 can be glued on the upper reflective surface 60a of the reflective layer 60, so the reflective layer 60 is disposed between the upper surface 102 of the circuit board 10 and the bottom surface 244 of the spacer 24. The spacer 24 has a plurality of accommodation holes 26, which penetrate through the top surface 242 and the bottom surface 244. The accommodation holes 26 are arranged along the long axis direction X and respectively correspond to the openings 602 and the through holes 604 of the reflective layer 60 and the sensing regions 12 of the circuit board 10. A spacer rib 28 is formed between two adjacent accommodation holes 26, i.e., the spacer rib 28 separates two adjacent accommodation holes 26.

In this embodiment, the spacer 24 has a first spacer section 30 and a second spacer section 32 in the short axis direction Y. The first spacer section 30 has the accommodation holes 26, and the illuminant elements 22 extend into the accommodation holes 26, respectively. In the short axis direction Y, the length of the first spacer section 30 is larger than the length of the second spacer section 32. The spacer 24 has two opposite long sides 24a, 24b in the short axis direction Y, and each of the long sides 24a, 24b extends along the long axis direction X. One of the long sides 24a, 24b (e.g. 24a) is located at the first spacer section 30, and the other long side (e.g. 24b) is located at the second spacer section 32. One of the two long sides 24a, 24b which is closer to the illuminant elements 22 (i.e., the long side 24b of the second spacer section 32) constitutes the light-leaking edge 246. The light-leaking edge 246 of the spacer 24 corresponds to the board edge 106 of the circuit board 10, and in the stacking direction, the light-leaking edge 246 is located above the board edge 106 of the circuit board 10.

In this embodiment, each opening 602 and each through hole 604 of the reflective layer 60 are located within the accommodation hole 26 in the stacking direction Z. In an embodiment, the reflective layer 60 can be omitted, so the spacer 24 is directly disposed on the circuit board 10, and the bottom surface 244 of the spacer 24 directly faces the upper surface 102 of the circuit board 10.

The light guide plates 34 are respectively disposed in the accommodation holes 26 of the spacer 24, and the side light-emitting surface 222 of each of the illuminant elements 22 faces toward each of the light guide plates 34. Each of the light guide plates 34 has a receiving portion. In this embodiment, the receiving portion is taken a notch 342 as an example, but not limited thereto. The receiving portion can be a concave groove or a through hole. Each notch 342 is formed by recessing from a side of the respective light guide plate 34. Each of the illuminant elements 22 extends into the notch 342 of the light guide plate 34. Each notch 342 surrounds the side light-emitting surface 222 of the respective illuminant elements 22. The side light-emitting surface 222 of the illuminant element 22 faces the wall surface of the notch 342 of the light guide plate 34. The notch 342 has a long light-input side 342a and two short light-input sides 342b. The long light-input side 342a faces the side light-emitting surface 222 of the illuminant element 22 in the short axis direction Y, and the two short light-input sides 342b are located at two opposite sides of the side light-emitting surface 222 of the illuminant element 22 in the long axis direction X. Light emitted from the side light-emitting surface 222 of the illuminant element 22 majorly enters the light guide plate 34 from the long light-input side 342a. Light emitted from the side light-emitting surface 222 toward two sides can enter the light guide plates 34 from the two short light-input sides 342b to promote the amount of light entering the light guide plate 34.

In an embodiment, each of the illuminant elements 22 can be located at one side of the light guide plate 34, and the light guide plate 34 may not be provided with the receiving portion, so light emitted from the side light-emitting surface 222 of the illuminant element 22 can enter the light guide plate 34 from the side of the light guide plate 34.

The shielding sheet 36 includes a main section 38, a first extension section 40, and a second extension section 42. The main section 38 covers the top surface 242 of the spacer 24. For example, the main section 38 is glued on the top surface 242 of the spacer 24. The main section 38 confines the light guide plates 34 within the accommodation holes 26 of the spacer 24. The main section 38 has a plurality of light permeable regions 382. The light permeable regions 382 are arranged along the long axis direction X and respectively correspond to the light guide plates 34. Each light guide plate 34 is located under each light permeable region 382 in the stacking direction Z.

The first extension section 40 covers the light-leaking edge 246 of the spacer 24 and the board edge 106 of the circuit board 10. The second extension section 42 is connected to the first extension section 40 and combined with the lower surface 104 of the circuit board 10. For example, the second extension section 42 is glued on the lower surface 104 of the circuit board 10. The first extension section 40 can be combined with the light-leaking edge 246 of the spacer 24 and the board edge 106 of the circuit board 10 by adhesives. Alternatively, the first extension section 40 may not be combined with the light-leaking edge 246 of the spacer 24 and the board edge 106 of the circuit board 10. More specifically, the first extension section 40 is connected to one side of the main section 38 that is closer to the light-leaking edge 246 of the spacer 24, and the first extension section 40 extends downward along the stacking direction Z to further cover the edge of the reflective layer 60. The second extension section 42 extends along the short axis direction Y and at least extends to the lower surface 104 of the circuit board 10 to be located right below the second spacer section 32 of the spacer 24 to prevent the second extension section 42 from warping with respect to the lower surface 104 of the circuit board 10. In this embodiment, an end of the second extension section 42 extends in the short axis direction Y to be below the hole wall 26a of the accommodation hole 26 and does not extend to be right below the illuminant element 22.

In this embodiment, the shielding sheet 36 includes a transparent substrate 44 and at least one shielding layer disposed on the transparent substrate 44. The at least one shielding layer overlaps the illuminant elements in the stacking direction Z. In this embodiment, the at least one shielding layer can be a two-layered structure including a reflector layer 46 and an absorption layer 48. An inner surface 442 of the transparent substrate 44 is configured to combine the shielding sheet 36 with the circuit board 10. The reflector layer 46 can be a white paint coated on an outer surface 444 of the transparent substrate 44. The absorption layer 48 can be a black paint coated on the outer side of the reflector layer 46, and the edge of the reflector layer 46 is covered by the absorption layer 48. On the main section 38, the absorption layer 48 has a plurality of hollow regions 482, and each hollow region 482 and the underlying portion of the transparent substrate 44 constitute each light permeable region 382. In an embodiment, the at least one shielding layer can be a single-layered structure. For example, only one of the reflector layer 46 and the absorption layer 48 is disposed.

The top plate 50 is disposed on the main section of the shielding sheet 36. The top plate 50 has a plurality of light-exit regions 502, and each light-exit region 502 can be, for example, a symbol/character. The light-exit regions 502 are arranged along the long axis direction X and correspond to the light permeable regions 382 of the main section 38 of the shielding sheet 36. Each light-exit region 502 of the top plate 50, each light permeable region 382 of the main section 38 of the shielding sheet 36, and each sensing region 12 of the circuit board 10 overlap in the stacking direction Z. In this embodiment, the top plate 50 includes a transparent plate 52 and a bottom layer 54. For example, the transparent plate 52 can be a glass plate, and the front surface of the transparent plate 52 is an operation surface 522, and the operation surface 522 is provided for the user to touch. The bottom layer 54 can be a bottom paint, which has a light-shielding effect and is printed on the backside of the transparent plate 52 to define the shape of the light permeable regions 382. The bottom layer 54 can be disposed on the main section 38 of the shielding sheet 36 by adhesives. The top plate 50 has a plate edge 504. The plate edge 504 extends along the long axis direction X and adjacent to the first extension section 40 of the shielding sheet 36.

Light emitted from each illuminant element 22 enters each light guide plate 34 and then is emitted out from the operation surface 522 through each light permeable region 382 of the shielding sheet 36 and each light-exit region 502 of the top plate 50. When the user touches the operation surface 522 at a position corresponding to any of the light-exit regions 502 of the top plate 50, the sensing region 12 of the circuit board 10 under the touched light-exit region 502 will sense the touch operation of the user. Since the light-leaking edge 246 of the spacer 24 is covered by the first extension section 40 of the shielding sheet 36, the leakage of light can be prevented. Accordingly, the user will not see light that leaks from the plate edge 504 of the top plate 50. Moreover, since each light guide plate 34 is located in the accommodation hole 26 of the spacer 24, and adjacent accommodation holes 26 are separated by the spacer rib 28 of the spacer 24, light from the light guide plate 34 in the accommodation hole 26 will not enter the adjacent accommodation hole 26 to influence light emitted from the adjacent light-exit region 502.

Figure 6:
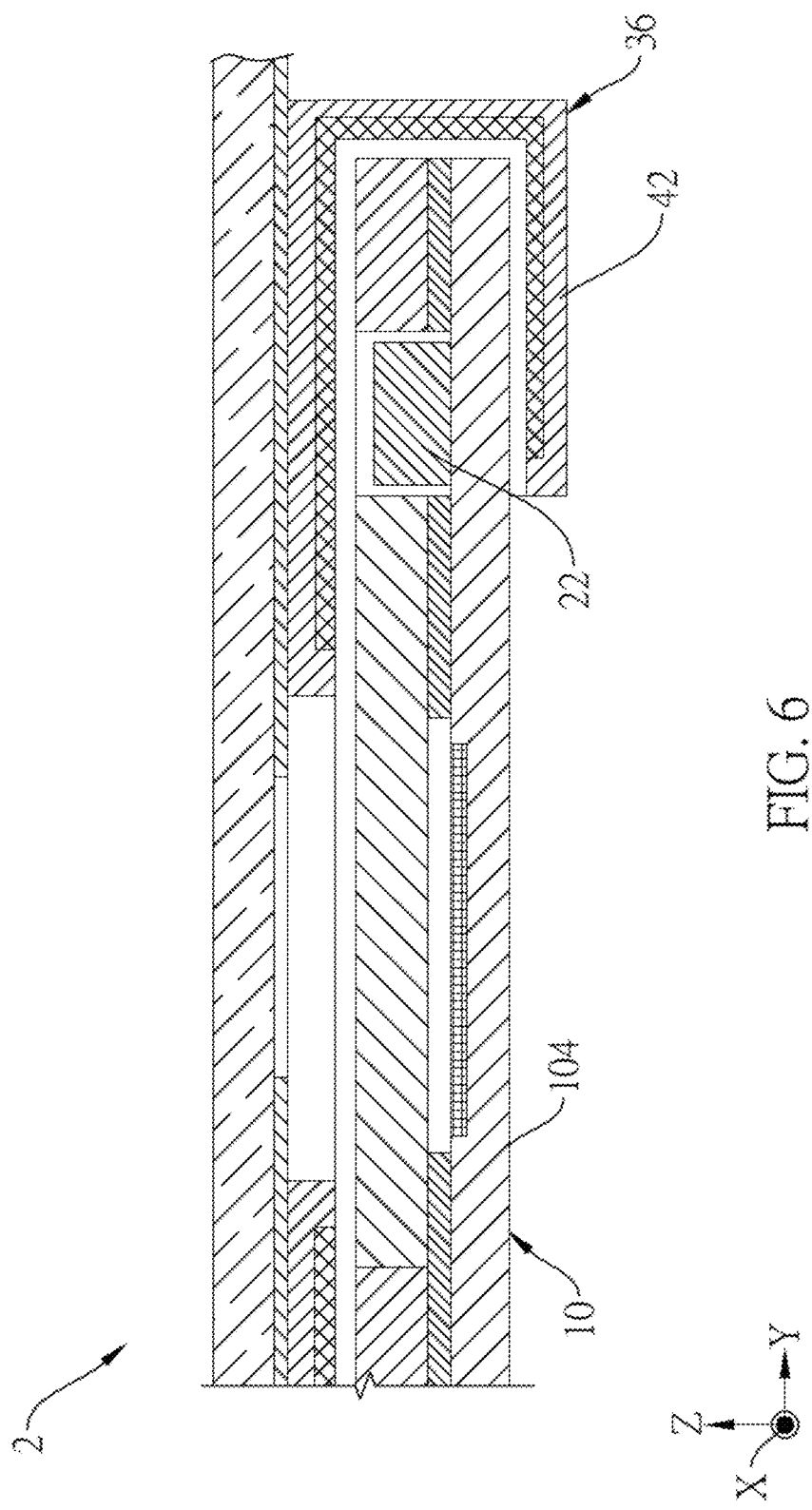
FIG. 6 is a schematic cross-sectional view of the touch input device in a second embodiment of the invention.

FIG. 6 illustrates the touch input device 2 in a second embodiment of the invention, which substantially has the same structure as the first embodiment, but different in that the second extension section 42 of the shielding sheet 36 extends to the lower surface 104 of the circuit board 10 to be located right below the illuminant elements 22. Compared with the first embodiment, in this embodiment, the second extension section 42 has a larger coupling area with the lower surface 104 of the circuit board 10, that can reduce the possibility of the second extension section 42 warping with respect to the lower surface 104 of the circuit board 10.

Figure 7:
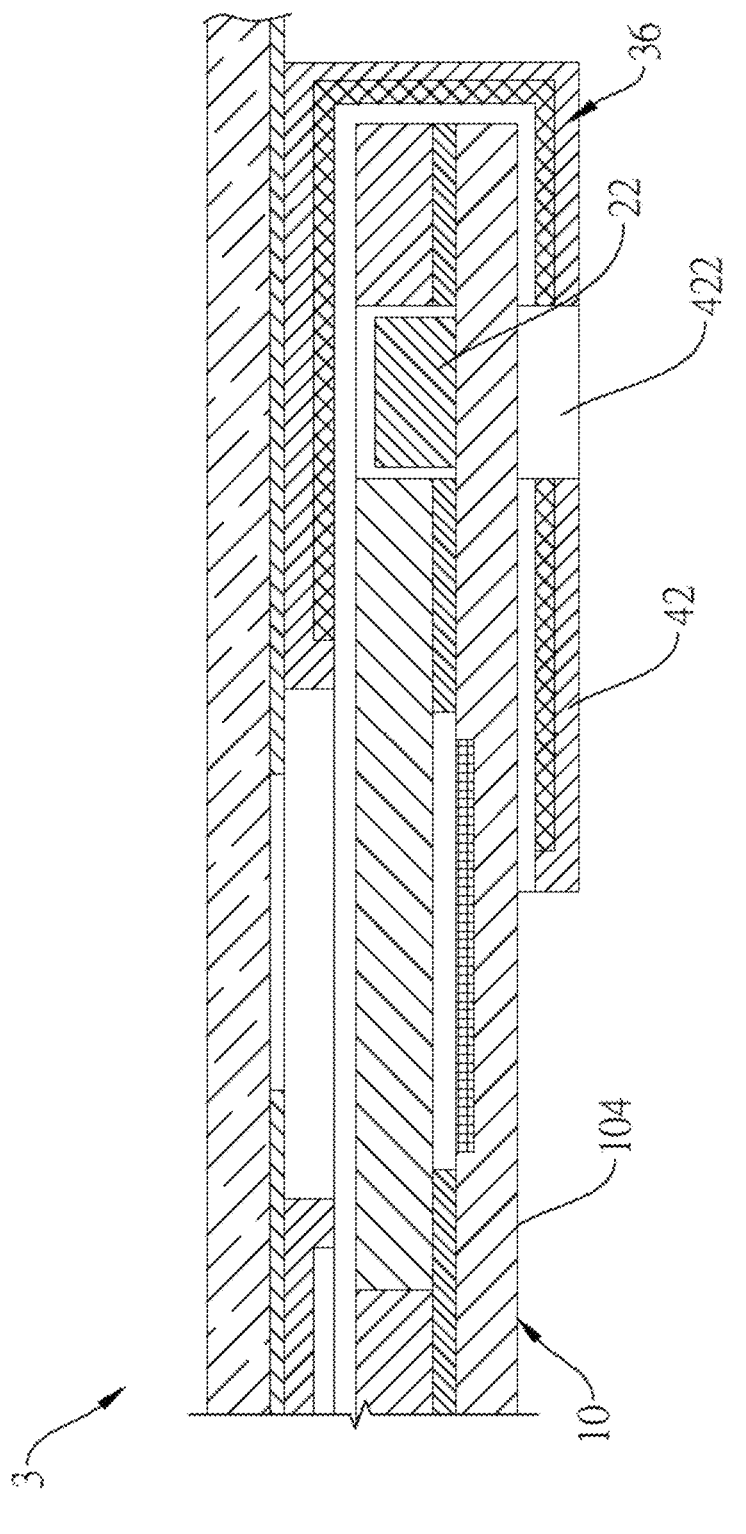
FIG. 7 is a schematic cross-sectional view of the touch input device in a third embodiment of the invention.

FIG. 7 illustrates the touch input device 3 in a third embodiment of the invention, which substantially has the same structure as the second embodiment, but different in that the second extension section 42 of the shielding sheet 36 extends to the lower surface 104 of the circuit board 10 to be located right below the sensing regions 12. In this embodiment, the second extension section 42 has a much larger coupling area with the lower surface 104 of the circuit board 10, so the coupling strength will be much stronger, and the second extension section 42 is less prone to warp with respect to the lower surface 104 of the circuit board 10.

Moreover, in this embodiment, the second extension section 42 of the shielding sheet 36 can be optionally provided with a plurality of heat dissipation holes 422. The heat dissipation holes 422 are arranged along the long axis direction X and respectively located right under the illuminant elements 22. As such, heat from each of the illuminant elements 22 can be transferred to the circuit board 10 and then dissipated through each of the heat dissipation holes 422.

Figure 8:
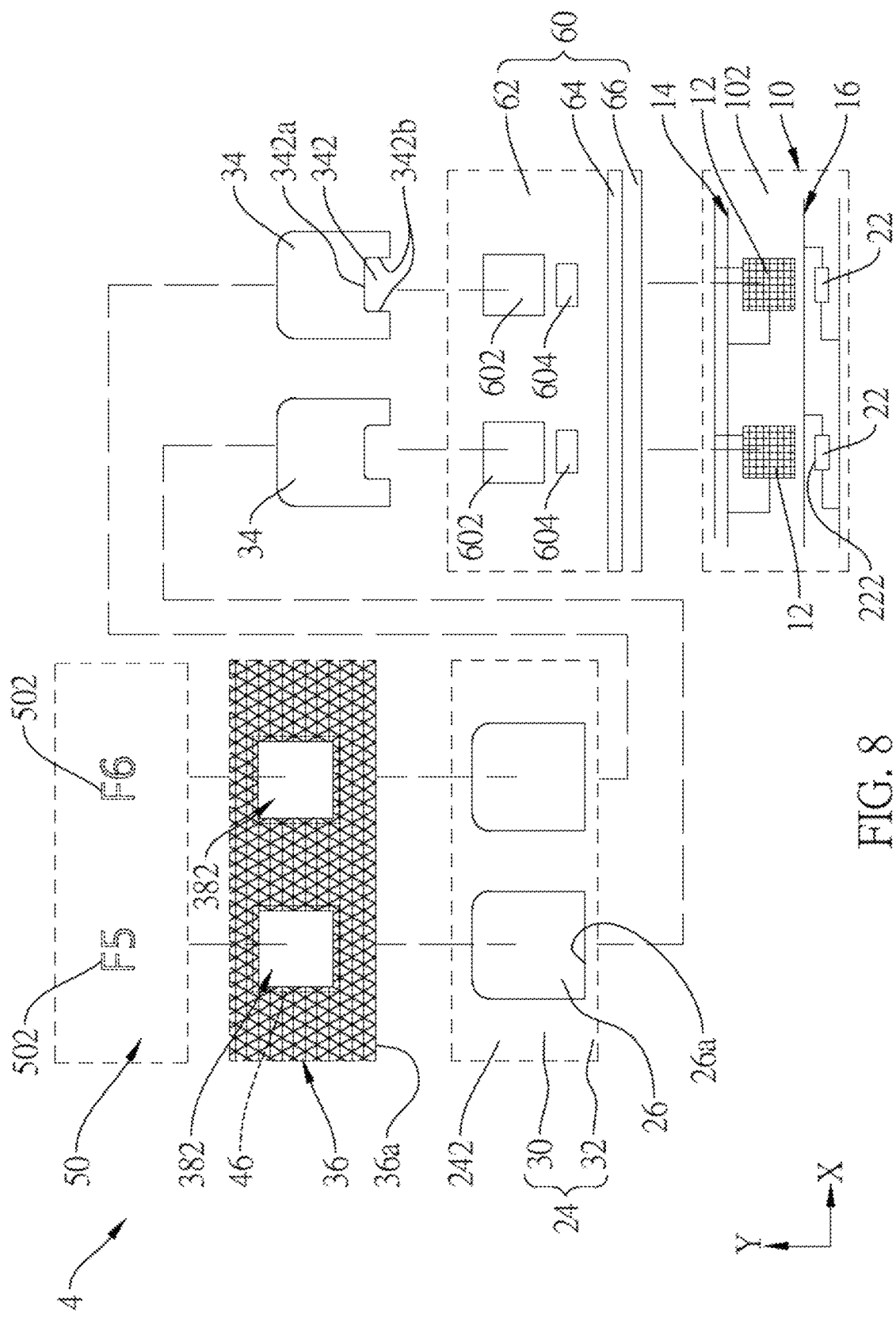
FIG. 8 is a partially exploded view of the touch input device in a fourth embodiment of the invention.
Figure 9:
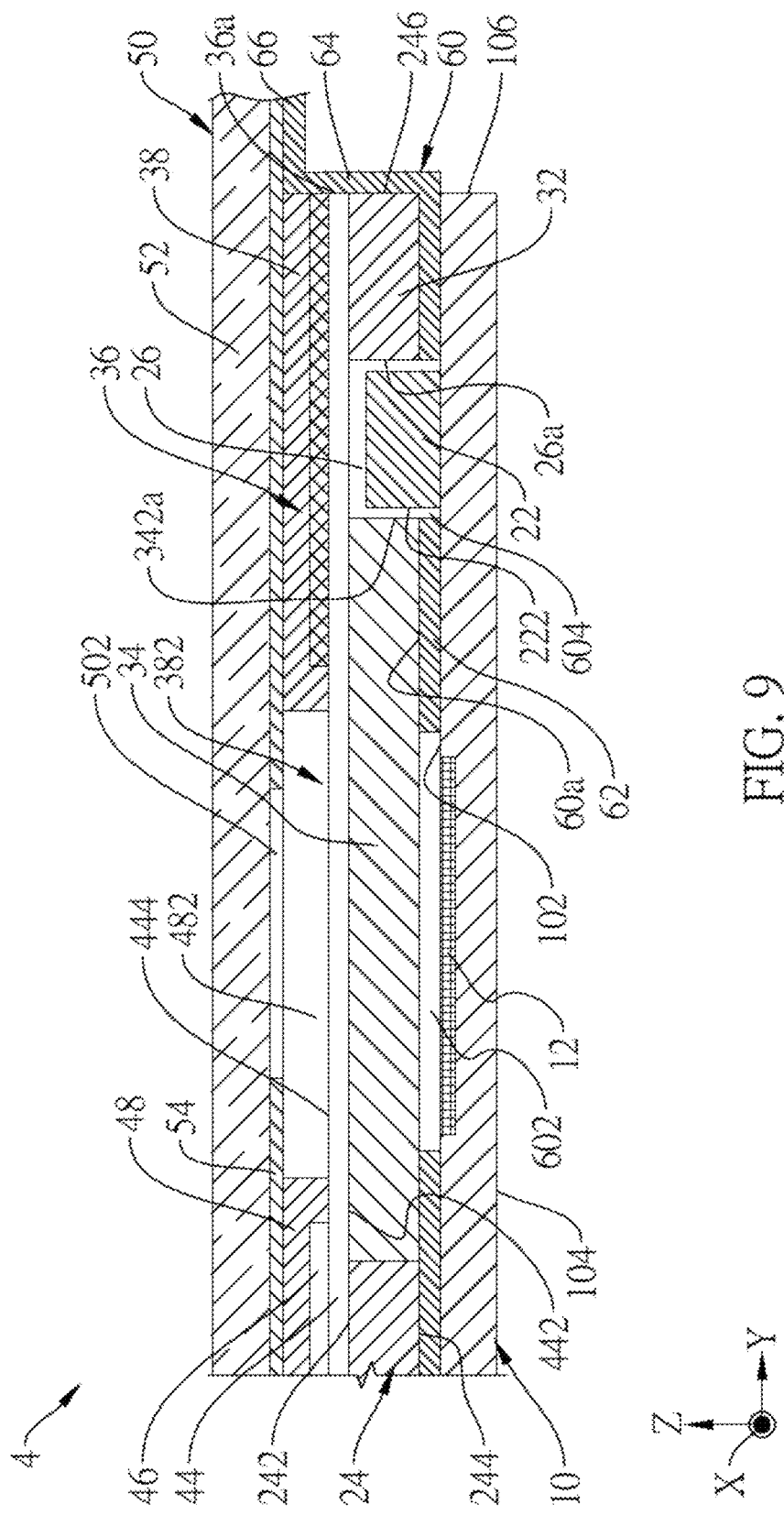
FIG. 9 is a schematic cross-sectional view of the touch input device in the fourth embodiment of the invention.

FIGS. 8 and 9 illustrate the touch input device 4 in a fourth embodiment of the invention, which substantially has the same structure as the first embodiment, but different in that: the reflective layer 60 includes a main reflective section 62, a first extension section 64, and a second extension section 66. The main reflective section 62 is disposed on the upper surface 102 of the circuit board 10, and the main reflective section 62 has the openings 602 and the through holes 604. The first extension section 64 is connected to the main reflective section 62, and the first extension section 64 extends upward along the stacking direction Z. The second extension section 66 of the reflective layer 60 is connected to the first extension section 64 and combined with the top plate 50. More specifically, the second extension section 66 is combined with the bottom of the top plate 50. For example, the second extension section 66 is combined with the bottom layer 54 of the top plate 50 by adhesives. In an embodiment, the main reflective section 62 may not be provided with the openings 602.

The spacer 24 is disposed on the main reflective section 62 of the reflective layer 60. For example, the spacer 24 is disposed on the upper reflective surface 60a of the main reflective section 62 of the reflective layer 60 by adhesives. In the short axis direction Y, each illuminant element 22 is located between each sensing region 12 of the circuit board 10 and the light-leaking edge 246 of the spacer 24.

The shielding sheet 36 is constituted by the main section 38 and not provided with the first extension section 40 and the second extension section 42 as the first embodiment. The shielding sheet 36 has a sheet edge 36a, and the sheet edge 36a corresponds to the light-leaking edge 246 of the spacer 24. In other words, the sheet edge 36a is located above the light-leaking edge 246 in the stacking direction Z. In this embodiment, the transparent substrate 44 at the sheet edge 36a is not covered by the absorption layer 48. The first extension section 64 of the reflective layer 60 covers the light-leaking edge 246 of the spacer 24 and the sheet edge 36a of the shielding sheet 36.

Since the light-leaking edge 246 of the spacer 24 and the sheet edge 36a of the shielding sheet 36 are covered by the first extension section 64 of the reflective layer 60, the leakage of light can be prevented, and the user will not see light leaking from the plate side 504 of the top plate 50. It is noted that since the transparent substrate 44 of the shielding sheet at the sheet edge 36a is not covered by the absorption layer 48, the first extension section 64 of the reflective layer 60 will reflect light from the transparent substrate 44 at the sheet edge 36a back to the light guide plates 34. Therefore, the amount of light input to the light guide plates 34 can be increased, and the brightness of light from the light-exit regions 502 of the top plate 50 can be correspondingly enhanced.

Although the preferred embodiments of the present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A touch input device, comprising:
    a circuit board having an upper surface, a lower surface, and a board edge, the upper surface having a plurality of sensing regions arranged along a long axis direction;
    a plurality of illuminant elements disposed on the upper surface of the circuit board and arranged along the long axis direction;
    a spacer disposed over the upper surface of the circuit board, the spacer having a top surface, a bottom surface, and a light-leaking edge, the spacer having a plurality of accommodation holes penetrating through the top surface and the bottom surface and respectively corresponding to the plurality of sensing regions, the light-leaking edge corresponding to the board edge of the circuit board, wherein the plurality of illuminant elements extend into the plurality of accommodation holes, respectively;
    a plurality of light guide plates disposed in the plurality of accommodation holes, respectively;
    a shielding sheet comprising a main section, a first extension section, and a second extension section, the main section covering the top surface of the spacer and having a plurality of light permeable regions, the light permeable regions arranged along the long axis direction and respectively corresponding to the plurality of light guide plates, the first extension section covering the light-leaking edge of the spacer and the board edge of the circuit board, the second extension section connected to the first extension section and combined with the lower surface of the circuit board; and a top plate disposed on the main section of the shielding sheet, the top plate having a plurality of light-exit regions arranged along the long axis direction and respectively corresponding to the plurality of light permeable regions of the main section of the shielding sheet.

2. The touch input device of claim 1, wherein each of the illuminant elements is located between each of the sensing regions of the circuit board and the board edge.

3. The touch input device of claim 2, wherein the circuit board further having two long sides in a short axis direction; each of the two long sides extends along the long axis direction; one of the two long sides of the circuit board closer to the plurality of illuminant elements constitutes the board edge.

4. The touch input device of claim 3, wherein the spacer further having a first spacer section and a second spacer section in the short axis direction; the first spacer section has the accommodation holes; the second spacer section has the light-leaking edge; the second extension section of the shielding sheet extends to the lower surface of the circuit board to be located right below the second spacer section of the spacer.

5. The touch input device of claim 4, wherein the second extension section of the shielding sheet extends to the lower surface of the circuit board to be located right below the plurality of illuminant elements, or the second extension section of the shielding sheet extends to the lower surface of the circuit board to be located right below the plurality of sensing regions.

6. The touch input device of claim 5, wherein the second extension section of the shielding sheet extends to be right below the plurality of sensing regions; the second extension section of the shielding sheet has a plurality of heat dissipation holes arranged along the long axis direction and respectively located right under the plurality of illuminant elements.

7. The touch input device of claim 2, wherein each of the plurality of light guide plates has a receiving portion; each of the plurality of illuminant elements extends into the receiving portion of each of the plurality of light guide plates; each of the plurality of illuminant elements has a side light-emitting surface facing a wall surface of the receiving portion.

8. The touch input device of claim 1, further comprising a reflective layer disposed between the upper surface of the circuit board and the bottom surface of the spacer; the reflective layer has a plurality of through holes arranged along the long axis direction; the plurality of illuminant elements extend through the plurality of through holes, respectively.

9. The touch input device of claim 8, wherein the reflective layer further having a plurality of openings; the plurality of openings are arranged along the long axis direction and respectively correspond to the plurality of accommodation holes and the plurality of sensing regions of the circuit board.

10. The touch input device of claim 1, wherein each of the plurality of light-exit regions of the top plate, each of the plurality of light permeable regions of the main section of the shielding sheet, and each of the plurality of sensing regions of the circuit board overlap in a stacking direction.

11. The touch input device of claim 10, wherein the shielding sheet further comprises a transparent substrate and at least one shielding layer disposed on the transparent substrate; the at least one shielding layer overlaps the plurality of illuminant elements in the stacking direction.

12. A touch input device, comprising:
a circuit board having an upper surface and a lower surface, the upper surface having a plurality of sensing regions arranged along a long axis direction;
a plurality of illuminant elements disposed on the upper surface of the circuit board and arranged along the long axis direction;
a reflective layer comprising a main reflective section, a first extension section, and a second extension section, wherein the main reflective section is disposed on the upper surface of the circuit board and has a plurality of through holes, the plurality of through holes are arranged along the long axis direction, and the plurality of illuminant elements extend through the plurality of through holes, respectively;
a spacer disposed over the main reflective section of the reflective layer, the spacer having a top surface, a bottom surface, and a light-leaking edge, the spacer having a plurality of accommodation holes penetrating through the top surface and the bottom surface, the plurality of accommodation holes arranged along the long axis direction and respectively corresponding to the plurality of sensing regions and the plurality of through holes, wherein the plurality of illuminant elements extend into the plurality of accommodation holes, respectively;
a plurality of light guide plates disposed in the plurality of accommodation holes of the spacer, respectively;
a shielding sheet covering the top surface of the spacer, the shielding sheet having a sheet edge and a plurality of light permeable regions, the sheet edge corresponding to the light-leaking edge of the spacer, the plurality of light permeable regions arranged along the long axis direction and respectively corresponding to the plurality of light guide plates; and
a top plate disposed on the shielding sheet, the top plate having a plurality of light-exit regions arranged along the long axis direction and respectively corresponding to the plurality of light permeable regions of the shielding sheet,
wherein the first extension section of the reflective layer covers the light-leaking edge of the spacer and the sheet edge of the shielding sheet; the second extension section of the reflective layer is connected to the first extension section and combined with the top plate.

13. The touch input device of claim 12, wherein the main reflective section has a plurality of openings; the plurality of openings are arranged along the long axis direction and respectively correspond to the plurality of accommodation holes and the plurality of sensing regions of the circuit board.

14. The touch input device of claim 12, wherein the second extension section of the reflective layer is combined with a bottom of the top plate.

15. The touch input device of claim 12, wherein each of the plurality of illuminant elements is located between each of the plurality of sensing regions of the circuit board and the light-leaking edge of the spacer.

16. The touch input device of claim 15, wherein the spacer further having two long sides opposite to each other in a short axis direction; each of the two long sides extends along the long axis direction; one of the two long sides closer to the plurality of illuminant elements constitutes the light-leaking edge.

17. The touch input device of claim 15, wherein each of the plurality of light guide plates has a receiving portion; each of the plurality of illuminant elements extends into the receiving portion of each of the plurality of light guide plates; each of the plurality of illuminant elements has a side light-emitting surface facing a wall surface of the receiving portion.

18. The touch input device of claim 12, wherein each of the plurality of light-exit regions of the top plate, each of the plurality of light permeable regions of a main section of the shielding sheet, and each of the plurality of sensing regions of the circuit board overlap in a stacking direction.

19. The touch input device of claim 18, wherein the shielding sheet further comprises a transparent substrate and at least one shielding layer disposed on the transparent substrate; the at least one shielding layer overlaps the plurality of illuminant elements in the stacking direction.

20. The touch input device of claim 19, wherein the transparent substrate of the shielding sheet at the sheet edge is not covered by the at least one shielding layer.

\* \* \* \* \*